(12) United States Patent
Bitschnau et al.

(10) Patent No.: US 12,203,999 B2
(45) Date of Patent: Jan. 21, 2025

(54) HIGH CURRENT SOURCE FOR A TEST SYSTEM FOR TESTING AN ELECTRICAL POWER DEVICE, AND TEST SYSTEM

(71) Applicant: OMICRON Electronics GmbH, Klaus (AT)

(72) Inventors: Lukas Bitschnau, Braz (AT); Horst Schedler, Rankweil (AT)

(73) Assignee: OMICRON Electronics GmbH, Klaus (AT)

( * ) Notice: Subject to any disclaimer, the term of this patent is extended or adjusted under 35 U.S.C. 154(b) by 100 days.

(21) Appl. No.: 17/789,422

(22) PCT Filed: Jan. 8, 2021

(86) PCT No.: PCT/EP2021/050292
§ 371 (c)(1),
(2) Date: Jun. 27, 2022

(87) PCT Pub. No.: WO2021/140211
PCT Pub. Date: Jul. 15, 2021

(65) Prior Publication Data
US 2023/0341476 A1    Oct. 26, 2023

(30) Foreign Application Priority Data

Jan. 10, 2020  (AT) ............................... A50012/2020

(51) Int. Cl.
*G01R 17/10*     (2006.01)
*G01R 31/327*    (2006.01)
(Continued)

(52) U.S. Cl.
CPC ............. *G01R 31/62* (2020.01); *G01R 17/10* (2013.01); *G01R 31/3274* (2013.01); *G01R 31/3333* (2013.01)

(58) Field of Classification Search
CPC ........................... G01R 31/3274; G01R 17/10
See application file for complete search history.

(56) References Cited

U.S. PATENT DOCUMENTS

2016/0178397 A1    6/2016  Jost et al.
2018/0309372 A1*  10/2018  Leong ............... H02M 3/33546
2020/0041567 A1    2/2020  Armstrong et al.

FOREIGN PATENT DOCUMENTS

CN        103954866 A        7/2014
CN        110635691 A       12/2019
(Continued)

*Primary Examiner* — Alesa Allgood
(74) *Attorney, Agent, or Firm* — Seyfarth Shaw LLP; Brian Michaelis (57) ABSTRACT

A high current source (200) for a test system for testing an electric power device (30) comprises a first plurality of first switchable half-bridges (212) and a second plurality of second switchable half-bridges (222), which are connected in parallel and by means of which a test current is redundantly distributed. A control device (280) is designed to control the first and second half-bridges (212, 222) on the basis of an input signal in such a way that an output signal for the test current, which corresponds to the input signal, is applied across a bridge branch (230) between the first switchable half-bridges (212) and the second switchable half-bridges (222).

12 Claims, 3 Drawing Sheets

(51) Int. Cl.
    *G01R 31/333*     (2006.01)
    *G01R 31/62*     (2020.01)

(56) References Cited

FOREIGN PATENT DOCUMENTS

| | | | |
|---|---|---|---|
| CN | 208736943 U | 12/2019 | |
| CN | 209860811 U | 12/2019 | |
| DE | 102012222944 A1 * | 6/2014 | ............ H02M 3/158 |
| DE | 102014119531 A1 | 6/2016 | |
| DE | 102018105881 B3 | 6/2019 | |
| KR | 10-2014-0076502 A | 6/2014 | |

* cited by examiner

HIGH CURRENT SOURCE FOR A TEST SYSTEM FOR TESTING AN ELECTRICAL POWER DEVICE, AND TEST SYSTEM

CROSS-REFERENCE TO RELATED APPLICATION DATA

The present application is a National Stage application of International Application No. PCT/EP2021/050292, filed Jan. 8, 2021, which claims priority to Austrian Patent Application No. A50012/2020, filed Jan. 10, 2020, both of which are incorporated by reference herein in their entireties.

FIELD OF THE INVENTION

The invention lies in the field of high-current measurement technology and relates in particular to a high-current source for a test system for testing an electrical energy apparatus and a test system with a high-current source of this kind.

BACKGROUND

Electrical energy apparatuses such as power transformers or switchgear assemblies are usually used in electrical energy supply networks to convert and distribute electrical energy. Further electrical energy apparatuses such as high-voltage transformers or high-current transformers, for example as instrument transformers for measuring voltages and currents occurring in a power grid, circuit breakers, such as primary relays and secondary relays, or for example for distributing electrical energy or as component parts of a protective system, and power generators are also commonly used in this context. Electrical energy apparatuses of this kind or further electrical energy apparatuses such as electric (power) motors are also used in the industrial field, in particular for production.

In order to commission or to service installations comprising electrical energy apparatuses of this kind, it may be necessary to check the functions and properties thereof. Here, electrical contacts, the switching behavior or the conducting behavior of an electrical energy apparatus, such as a circuit breaker, a transformer with any tap changers, a grounding installation or a rotating machine, for example of a generator or an electric motor, can be checked by measuring the resistance with a test current, for example. A transformation ratio of an electrical energy apparatus, such as a power transformer or a current transformer, can also be measured here for example with a test current. Measurements of this kind can be particularly relevant because these functions and properties can change for instance due to ageing, transport damage, manufacturing defects, short circuits or magnetization of a (transformer) core and consequently regular monitoring may be necessary to ensure the operational reliability of the electrical energy apparatus and the corresponding high-voltage installation.

Measurements of this kind are often carried out during field use, i.e. outdoors or in an industrial environment. In this case, the equipment used should have a low weight, especially for field use, and be robust for transport to the respective place of use.

SUMMARY OF THE INVENTION

There is therefore a need to improve testing of functions and properties of electrical energy apparatuses with a test current, and in particular to make a high-current source for this purpose and a test system more robust, easier to transport, more reliable or safer.

The invention meets this need in each case by a high-current source for a test system for testing an electrical energy apparatus as claimed, by a test system as claimed for testing an electrical energy apparatus with a test current, and by the use of a high-current source of this kind or a test system of this kind for testing an electrical energy apparatus with a test current as claimed in the claims The dependent claims relate to advantageous embodiments of the present invention.

A first aspect of the invention relates to a high-current source for a test system for testing an electrical energy apparatus. The high-current source has a first plurality of first switchable half-bridges that are connected in parallel and through the number of which a test current is divided redundantly. In addition, the high-current source has a second plurality of second switchable half-bridges that are connected in parallel and through the number of which the test current is divided redundantly.

A control unit of the high-current source is configured to control or actuate, based on an input signal, the first plurality of first switchable half-bridges and the second plurality of second switchable half-bridges in such a way that an output signal for the test current is present on a bridge branch between the first switchable half-bridges and the second switchable half-bridges, which output signal corresponds to the input signal.

One advantage of the high-current source and the associated high maximum current that can be generated as the test current—approximately 500 A or even in the kA range—can be in particular that it is possible to test the electrical energy apparatus with a test current that corresponds to a rated current for the operation of the electrical energy apparatus or is at least so high that during the test certain functions and properties of the electrical energy apparatus at least substantially correspond to the functions and properties during operation.

One advantage of redundantly dividing the test current can in particular be that the test current can still be generated even if individual switchable half-bridges fail, which in particular means that the test can be carried out more reliably and the robustness of the high-current source can be increased. Especially during field use or due to high test currents, test devices such as the high-current source can be loaded, for example mechanically during transport or thermally during operation, which could lead to the failure of individual half-bridges, and so the redundancy can also extend the service life of the high-current source.

Dividing the test current allows the thermal and/or electrical load on components of the high-current source, in particular the switchable half-bridges, to be reduced and the high-current source to therefore be made more reliable, failures to be reduced and/or better tests, in particular with higher currents or shorter waiting times, e.g. for cooling, to be executed.

Generating the test current on the bridge branch allows a higher voltage amplitude and therefore a higher (maximum) current to be achieved at a predetermined operating voltage of the high-current source and allows the operational reliability to be increased, in particular given that, with a symmetrical operating voltage, only about half of the voltage amplitude otherwise required relative to a ground potential has to be present on the side of the first switchable half-bridges and on the side of the second switchable half-bridges.

One advantage of generating the test current by means of the first plurality and second plurality of switchable half-bridges, in particular for generating a test current by means of a high-current transformer—can be in particular that the weight can be reduced, which in particular means that the high-current source or a test system having same is lighter and therefore easier to transport, which can be particularly advantageous during field use, but can also be advantageous when used elsewhere. Some variants of the high-current source can therefore weigh significantly less than 10 kg.

For the purposes of the invention, a "high-current source" is to be understood as meaning at least one current source that is configured to provide a high current, that is to say a current with a maximum value of at least 500 A. In principle, a high-current source of this kind can also provide a lower current, for example depending on the actuation thereof. A high-current source of this kind can also have different test current ranges that can be selected manually or automatically. For the purposes of the invention, the "high-current source" can also be understood as meaning that the high-current source is designed in the form of a structural unit. In this case, the high-current source can be configured as a high-current module, for example as an expansion module for a test system. An expansion module of this kind can be accommodated in a module slot of a main device of the test system.

For the purposes of the invention, a "high current" is to be understood in particular as meaning an electric current of at least 500 A. In the case of an electric AC current, the value can relate to the amplitude or the effective value of the AC current, and in the case of a DC current, to the DC current component and otherwise to the peak values or effective values that are the greatest in terms of absolute value.

For the purposes of the invention, a "high voltage" is to be understood in particular as meaning a voltage of at least 1000 V. In the case of an AC voltage, the value can relate to the amplitude or the effective value of the AC voltage, and in the case of a DC voltage, to the DC voltage component and otherwise to the peak values or effective values that are the greatest in terms of absolute value.

For the purposes of the invention, an "electrical energy apparatus" is to be understood as meaning an apparatus, for example as part of a high-voltage installation for supplying energy or as part of an electrically operated production installation, which is operated with a high voltage or a high electric current, controls, converts or measures same, or can be exposed to a high electric current for some other reason and therefore should be configured for safe operation, for example by means of sufficient electrical conductivity. An electrical energy apparatus can also be exposed to a high voltage for some other reason and should be configured for safe operation, for example by means of sufficient electrical insulation. An electrical energy apparatus that can be exposed to a high voltage and is configured for this is also referred to as a "high-voltage apparatus". In particular, an electrical energy apparatus of this kind can be a power transformer, a (high-voltage) switchgear assembly, a (high-voltage) safety switch or circuit breaker such as a primary relay or secondary relay, a grounding installation, a rotating machine which is operated with a high voltage or generates a high voltage, such as a power electric motor or a power generator, a tap changer for a transformer, an instrument transformer such as a high-voltage transformer or a high-current transformer, such as an inductive current transformer with a transformer core or with a Rogowski coil, or a non-inductive current transformer using field plates, Faraday effect, etc., or some other current transformer or voltage transformer. In particular, an electrical energy apparatus of this kind can also be another electrical device in which a measurement is to be carried out with a high current. In particular, a microohm measurement can also be carried out on an electrical energy apparatus of this kind by means of the high current of the high-current source and a measurement of the voltage occurring in the process.

According to some embodiments, the first switchable half-bridges each have two controllable switching elements that are each connected in series with a connecting point. The second switchable half-bridges also each have two controllable switching elements that are each connected in series with a connecting point. In this case, the connecting points of the first switchable half-bridges are connected in parallel and are electrically connected to a first side of the bridge branch. The connecting points of the second switchable half-bridges are also connected in parallel and are electrically connected to a second side of the bridge branch. Finally, the control unit is configured to control or actuate the controllable switching elements.

One advantage of the bridge branch between the first and the second switchable half-bridges for the output signal can be, for example in an advantageous combination with embodiments in which the first and second switchable half-bridges each have two controllable switching elements, in particular that no energy supply apparatus with a center tap is required for the high-current source.

Some embodiments, in which the connecting points of the first and second switchable half-bridges are each electrically connected to the first or second side of the bridge branch via a filter element, can in particular have the advantage that the individual switchable half-bridges can be decoupled, for example with regard to their switching behaviour, as a result of which, in some variants synchronous and therefore in particular simple actuation of the first and second switchable half-bridges can be improved, or in other variants asynchronous actuation of the first and second switchable half-bridges can be improved. In further embodiments, synchronous or asynchronous actuation is also possible without filter elements of this kind. In some variants, with or without filter elements, in which asynchronous actuation takes place, the control unit is configured to actuate the switchable half-bridges with a time offset, for example with predetermined time intervals or with a random distribution. In some variants with or without filter elements, the control unit is configured to carry out actuation in a non-synchronized and/or random manner.

In some embodiments, the switchable half-bridges each have a non-synchronized hysteresis coil current regulator, in particular in combination with an LC filter in each case. In this advantageous way, the respective current through the respective half-bridges can be regulated in a self-oscillating manner.

One advantage of generating the test current by means of the first plurality and second plurality of switchable half-bridges, in particular for generating a test current by means of a high-current transformer, can be in particular that, on account of the plurality of switchable half-bridges, simultaneous clocking/switching of all the half-bridges is unlikely.

One advantage of (randomly) offset switching of the half-bridges, for example on account of random or asynchronous actuation or respective regulation using hysteresis coil current regulation for example, can be in particular that current ripple or voltage ripple in the output signal, i.e. in particular of the test current, can be reduced.

Some embodiments, in which an energy supply apparatus is configured to receive electrical energy and to provide a positive and a negative supply voltage that is galvanically isolated therefrom to supply power to the switchable half-bridges, can in particular have the advantage that the operational reliability and/or the robustness—for example with respect to interspersed interference or interference caused by switching the switchable half-bridges—can be increased.

The operational reliability can be increased by galvanically isolating the input signal from the switchable half-bridges in some embodiments, wherein specifically the output signal is galvanically isolated from the input signal in some variants.

According to some embodiments, the first plurality of first switchable half-bridges and the second plurality of switchable half-bridges are configured to generate a high current of the order of magnitude of at least 500 A or even in the kA range as the test current.

According to some embodiments, the number of first switchable half-bridges is equal to the number of second switchable half-bridges, as a result of which in particular a symmetrical structure is advantageously made possible.

According to some embodiments, the first and/or second plurality includes a large number of first and second switchable half-bridges, respectively. In some variants, the switchable half-bridges can be or consist of discrete components. In some embodiments, all of the first and/or the second switchable half-bridges are also each configured to generate a maximum current of at least 3 A or of at most 200 A and to conduct said current in a switched-on state. In this advantageous way, the electrical and/or thermal load can be divided further, meaning that the load on individual components, in particular discrete components, can be reduced and only accounts for a small fraction of the total load. Variants with a larger number of first and/or second switchable half-bridges, for example 20, 40 or more first switchable half-bridges and/or for example 20, 40 or more second switchable half-bridges, can also be furthermore advantageous, in particular for higher test currents. In combination with the redundant division, an advantage can lie in particular in the increased fail safety and/or the increased robustness, particularly for field use.

A second aspect of the invention relates to a test system for testing an electrical energy apparatus with a test current. The test system has a portable main device with a housing that has a module slot for accommodating and connecting to an expansion module, and with a connection arrangement arranged on the housing for connection to a portable additional device. In addition, the test system has a high-current source according to the first aspect of the invention as the expansion module. Furthermore, the high-current source has a housing for the module slot and, arranged on the housing, an energy supply connection arrangement, an input connection arrangement and a first and a second high-current connection. The portable main device furthermore has a measuring apparatus for measuring measured variables and a control apparatus for controlling the measuring device and the high-current source for testing the electrical energy apparatus. In this case, the portable main device is configured to control the high-current source, when it is accommodated in the module slot, via the input connection arrangement and to supply said high-current source with energy via the energy supply connection arrangement. In this case, the high-current source is also configured, controlled by the control apparatus, to generate an output signal between the first and the second high-current connection and therefore to provide the test current.

The possible advantages, embodiments, developments or variants already mentioned above for the first aspect of the invention also apply accordingly to the test system according to the invention.

Some embodiments in which the module slot has or consists of a receiving shaft for the high-current source can in particular have the advantage that the external dimensions of the portable main device, or a casing of the portable main device, are at least substantially not changed by accommodating the high-current source or by omitting the high-current source, which in particular simplifies handling.

A third aspect of the invention relates to the use of a high-current source according to the first aspect of the invention or a test system according to the second aspect of the invention for testing an electrical energy apparatus with a test current. In this case, the high-current source or the high-current source of the test system is configured to generate the test current. In addition, at least one measured variable generated on the basis of the test current is measured for the test, preferably by means of a measuring device of the high-current source or the test system.

The possible advantages, embodiments, developments or variants already mentioned above for the preceding aspects of the invention also apply accordingly to the use according to the invention.

Further advantages, features and application possibilities are evident from the following detailed description of exemplary embodiments and/or from the figures.

BRIEF DESCRIPTION OF THE FIGURES

The invention is explained in greater detail below on the basis of advantageous exemplary embodiments with reference to the figures. Identical elements or components of the exemplary embodiments are identified substantially by identical reference signs, unless something to the contrary is described or unless something to the contrary is evident from the context.

In the figures, in each case schematically.

DETAILED DESCRIPTION OF EXEMPLARY EMBODIMENTS

Figure 1:
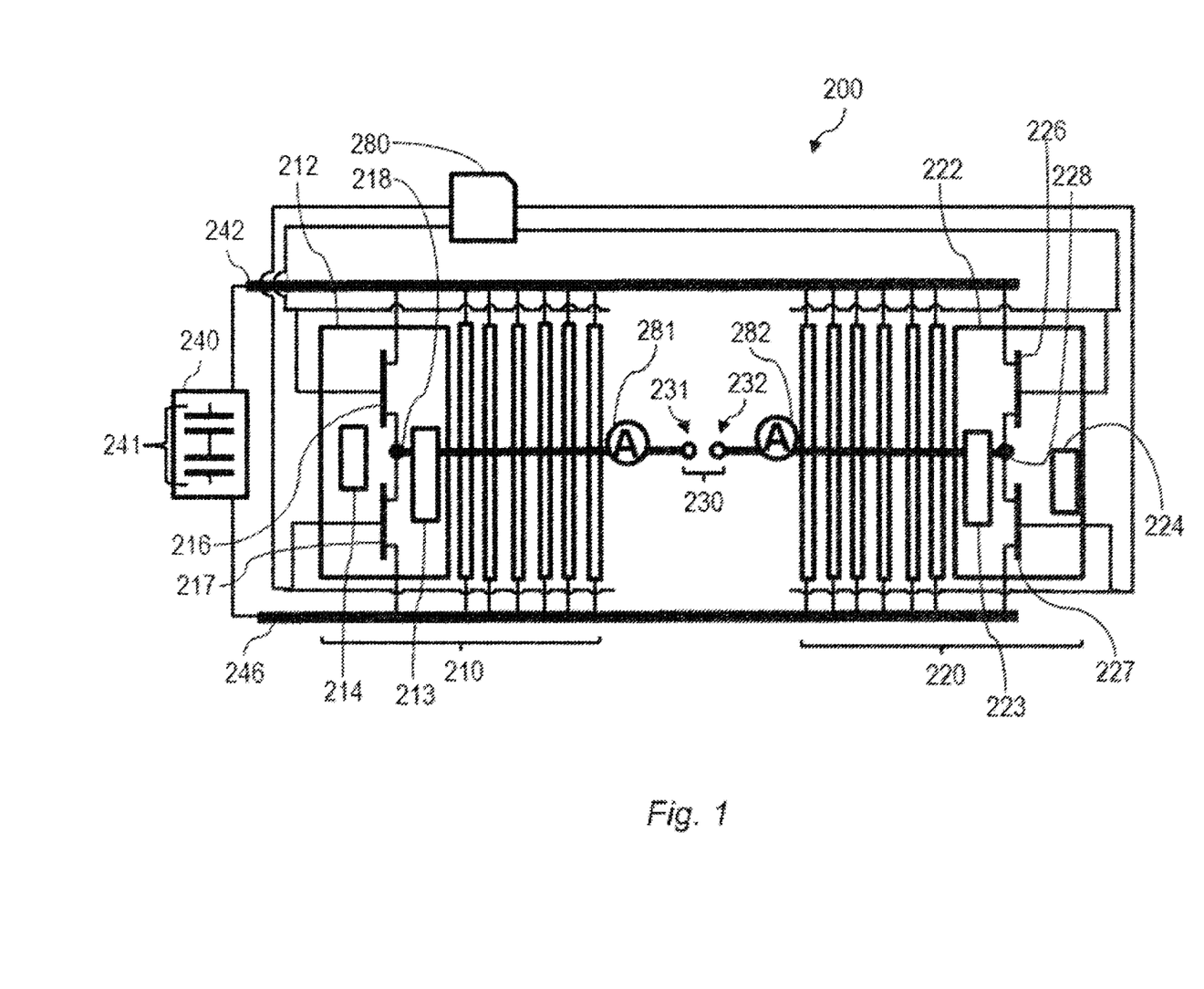
FIG. 1 shows a high-current source according to one embodiment.

FIG. 1 shows a high-current source 200 according to one embodiment of the present invention for a test system for testing an electrical energy apparatus.

In one exemplary embodiment, the high-current source 200 has a first plurality 210 of first switchable half-bridges 212, a second plurality 220 of second switchable half-bridges 222, a positive supply rail 242 and a negative supply rail 246 and an control unit 280. The control unit 280 is configured to control or actuate, based on an input signal, the first plurality 210 and the second plurality 220 in such a way that an output signal for a test current is present on a bridge branch 230 between the first and second switchable half-bridges, which output signal corresponds to the input signal.

In addition, some variants of the high-current source 200 have an energy supply apparatus 240 that is electrically connected to the positive and negative supply rails 242, 246 and is configured to provide a positive and a negative supply voltage for the first and the second plurality 210, 220 of first and second switchable half-bridges, respectively, via said supply rails. In other variants, the positive and negative supply rails 242, 246 can be contacted externally and supplied with supply voltages.

A first switchable half-bridge 212 of the first switchable half-bridges of the first plurality 210 is shown in greater detail in FIG. 1. As shown, the first switchable half-bridges each have two field-effect transistors 216, 217, such as MOSFETs, which are electrically connected in series with a connecting point 218. The field-effect transistors 216, 217 form a controllable switching element 216, which is electrically connected to the positive supply rail 242, and another controllable switching element 217, which is electrically connected to the negative supply rail 246, for each first switchable half-bridge. Some variants also have other controllable switching elements such as bipolar transistors, in particular instead of field-effect transistors.

The connecting points 218 of the first switchable half-bridges 212 are connected in parallel and are electrically connected to a first side 231 of the bridge branch 230. In this context, in some variants, the connecting points 218 can be electrically connected to one another directly or, alternatively, can in each case be connected to the first side 231 via a filter element 213 of the respective first half-bridges 210, 212. In some variants, the filter element 213 has or consists of an LC filter.

In addition, in some variants the high-current source 200 has a common first filter element and/or a first current sensor apparatus 281, meaning that the current flowing on the first side 231 of the bridge branch 230 can be filtered or captured, as a result of which advantageously in particular interference being emitted can be reduced on account of switching the controllable switching elements and a test current that is actually flowing can be determined, for example for the test or for a feedback loop. Furthermore, in some variants, the first current sensor apparatus 281 has a plurality of current sensors and is configured to capture the current flowing on the first side 231 of the bridge branch 230 as the sum of the currents flowing through the current sensors in each case. For this purpose, in some variants the current sensors are connected in parallel. Alternatively, in some variants, the current sensors are each assigned to one or more half-bridges such that they each capture an electric current that flows from/to the first side 231 in the respective half-bridges. In this advantageous way, the accuracy when capturing the current can be increased and/or the weight can be reduced compared to a current sensor apparatus with a single current sensor for a correspondingly higher current.

Furthermore, in some variants the first switchable half-bridges 210 each have a regulation element 214 that is configured to regulate switching of the controllable switching elements 216, 217 by means of a hysteresis coil current regulator, which is in particular self-oscillating and not synchronized with the respective other regulation elements 214, and for example based on a signal from a coil of the filter element 213, in particular the coil of the LC filter.

The same applies to the second plurality 220 of second switchable half-bridges, wherein a second switchable half-bridge 222 of the second switchable half-bridges is shown in more detail in FIG. 1 and these second switchable half-bridges each have two field-effect transistors (or more generally controllable switching elements) 226, 227 that are connected in series between the positive 242 and negative 246 supply rails via a connecting point 228. The high-current source 200 can also have a common second filter element and/or a second current sensor apparatus 282 correspondingly for a second side 232 of the bridge branch 230 to which the connecting points 228 are electrically connected. The second half-bridges 220 can also each have a regulation element 224 and/or a filter element 223 via which they are electrically connected to the second side 232.

FIG. 1 shows the first plurality 210 and the second plurality 220 each with a total of seven first and seven second switchable half-bridges. In further variants, the number of first and second switchable half-bridges can also be greater, for example advantageously greater than or equal to ten, twenty, forty or forty-eight. As a result, the test current to be generated can be divided (even) further, the probability of the half-bridges switching simultaneously can be reduced and therefore the current ripple or voltage ripple can be reduced and/or the test current can continue to be generated up to a predetermined maximum current even if individual half-bridges fail.

In some variants, in which the first and the second plurality 210, 220 are configured to generate a maximum current of at least 1 kA as the test current, the half-bridges are each designed for a maximum current of approximately or exactly 25 A and the number of first and second switchable half-bridges is forty in each case (or forty-eight for additional redundancy), as a result of which the test current to be provided is divided among forty 25 A half-bridges and, if necessary, there remains a reserve range of 200 A, for example as redundancy or for (brief) overload. In such a variant with forty first and forty second half-bridges, i.e. a total of eighty half-bridges, for 1 kA as test current and with a first current sensor apparatus 281 and a second current sensor apparatus 282, the first current sensor apparatus 281 has ten current sensors, wherein in each case a first one of the current sensors is configured to capture a current from a first group of four of the first half-bridges, a second one of the current sensors is configured to capture current from a second group of another four of the first half-bridges, etc., and the second current sensor apparatus 282 has ten corresponding current sensors. Dividing the capture of the current over a number of current sensors means that the weight can advantageously be reduced compared to a single current sensor for a correspondingly higher current.

In some variants, in which the first/second current sensor apparatus 281/282 has a plurality of current sensors and in particular the high-current source has a plurality of operating ranges, the first current sensor apparatus 281 (and correspondingly the second current sensor apparatus 282) has an additional current sensor. In this case, the current sensor apparatus 281 or 282 is configured—in particular for an operating range with a lower maximum test current, such as 100 A—to capture the current on the first 231 or second 232 side, at least up to a predetermined maximum current such as 100 A, by means of the additional current sensor. The accuracy can be increased in this advantageous way. Furthermore, in variants with an operating range for a lower maximum test current, operational reliability can be increased by limiting the maximum test current to the lower maximum test current.

In some alternative variants, the high-current source 200 only has one current sensor apparatus, that is to say either the current sensor apparatus 281 or the current sensor apparatus 282, as a result of which the weight can advantageously be reduced further. One advantage of variants with both current sensor apparatuses 281, 282 can be, in particular, that asymmetrical current flows can be captured.

In some variants, the first and second controllable switching elements 216, 217, 226, 227 are each discrete components, as a result of which in particular the thermal load can be better distributed. In further variants, in each case a plurality, for example two, four, six or ten, of the controllable switching elements can also be respectively combined to form a discrete component.

In some variants, the half-bridges are each constructed using SMD (surface-mounted device) technology on one printed circuit board each or on one or more common printed circuit boards. In this way, a lightweight and inexpensive structure can advantageously be achieved and/or the components can be cooled by means of the printed circuit board and possibly an air flow over the components.

Finally, the control unit 280 is configured to actuate the controllable switching elements 216, 217, 226, 227, for example via control lines, in such a way that they are switched on or off depending on the profile of the input signal—and in variants with a feedback loop, also depending on the output signal—and therefore, after possible filtering by filter elements, generate the output signal between the first side 231 and the second side 232 of the bridge branch 230. In some variants, the control unit 280 can regulate the test current by means of the current sensor apparatus 281 and/or the current sensor apparatus 282. Additionally or alternatively, in some variants the control unit 280 can control or regulate the test current by means of the regulation elements 214 and 224. Here, the high-current source 200, in particular the control unit 280, the first plurality 210 and the second plurality 220, is configured to generate at least one AC current with a maximum frequency of at least 3 kHz or a DC current or, more generally, a freely adjustable signal form, as the test current. In alternative variants, the high-current source can also be configured to generate only one AC current or an AC current with a lower or higher maximum frequency.

One advantage of the DC current can be in particular when it is used to test circuit breakers, i.e. for example what is known as "circuit breaker measurement", or in microohm measurement, which in particular can also test switching (/switch-off) behavior in the event of faults in which DC current occurs. One advantage of frequencies up to at least 3 kHz can in particular lie in the use thereof for testing a transmission behavior/ratio—for example with a current transformer/instrument transformer, i.e. what is known as a "CT ratio measurement"—wherein—especially with what is known as a "power quality measurement"—the transmission behavior can be checked as a function of the frequency and, if necessary, also as a function of the load. Variants with freely adjustable signal forms allow a DC current and/or one or more AC currents with possibly different amplitudes to be advantageously overlaid, which in particular reduces the length of time of a measurement process with at least substantially the same accuracy or makes it possible to measure non-linear effects, for example in the case of a "power quality measurement". In the case of variants that can generate both the DC current and the AC current, an advantage can also reside in the fact that an AC current measurement can also be carried out directly after a DC current measurement without changing the wiring. For example, in the case of a circuit breaker with a current transformer connected directly downstream, a microohm measurement can be carried out with DC current and immediately afterwards demagnetization can be carried out using AC current, as a result of which the current transformer is made ready to switch on again. For demagnetization or for other processes as part of or in addition to a measurement, the high-current source can have a voltage mode as the operating mode, in which a voltage of the output signal is controlled or regulated, in particular instead of the (test) current. For example, for demagnetization, ever smaller voltages and therefore currents can therefore be passed through a hysteresis curve in order to finally reach a point where there is no longer any magnetization. One advantage of a test current with a maximum current of at least 1 kA can be in particular that the electrical energy apparatus can be checked depending on the load and/or the test current used can already be in a range that does not damage the electrical energy apparatus and/or corresponds to a rated current of the electrical energy apparatus or is at least so close to the rated current that accuracy during the test can be increased.

In particular for increasing the accuracy, some variants of the high-current source 200 have an offset regulation apparatus. In this case, the high-current source 200 and/or the control unit 280 is configured to use the offset regulation apparatus to compensate for a (remaining/residual) offset DC current or an offset DC voltage or, more generally, a remaining deviation between the output signal to be generated in accordance with the input signal and the output signal actually generated by means of the first and second switchable half-bridges 210, 220. In some variants, an offset regulation apparatus of this kind has or consists of an analog regulation apparatus.

In some variants with an energy supply apparatus 240, the energy supply apparatus has a plurality of double-layer capacitors 241 and is configured to buffer the positive and/or the negative supply voltage by means of the double-layer capacitors 241, as a result of which (briefly) higher test currents or powers can be achieved, in particular without a more strongly resilient grid connection or a (permanently) more powerful energy supply apparatus with a correspondingly higher weight being necessary for the energy supply apparatus. In this case, a plurality of the double-layer capacitors 241 can be electrically connected in series in order to enable a higher voltage loading capacity. Typically, double-layer capacitors of this kind each have a voltage loading capacity of approximately 2.5 V. A supply voltage of 15 V can therefore be buffered with a series of six double-layer capacitors. One advantage of generating the test current by means of the plurality of first and second half-bridges in combination with the double-layer capacitors can be, in particular, that no high (positive and/or negative) supply voltage is required to generate the test current and therefore the number of double-layer capacitors to be interconnected in series for a sufficient dielectric strength can be relatively low, which in particular facilitates balancing of the double-layer capacitors connected in series (e.g. by means of a balancer) and therefore the production of the current source. Another advantage of this can be that, in addition to a buffered DC voltage or a buffered DC current being able to be provided, an AC current can also be generated as a test current, the energy necessary for the generation being buffered. Alternatively or additionally, the energy supply apparatus can have further energy stores such as rechargeable batteries for buffering or for providing energy without a grid connection. One advantage of the double-layer capacitors can be in particular that they enable a high current, are light in weight, reach a long service life and/or are unproblematic in terms of storage or shipping.

In some variants with an energy supply apparatus 240, the energy supply apparatus has a bidirectional DC-to-DC converter. For example, in one variant for a test current of up to 1 kA, the energy supply apparatus 240 can be configured, by means of the bidirectional DC-to-DC converter, to supply power to the first and the second plurality of half bridges, which are interconnected in particular via the bridge branch 230 to form a full bridge, by means of a supply voltage, that is to say a voltage difference between the positive and negative supply voltage, of 16 V—and possibly without a center tap. Advantageously, in combination with buffering, the bidirectional DC-to-DC converter can be configured to provide a current of up to 400 A. One advantage of the bidirectional DC-to-DC converter can be in particular that electrical energy that is supplied back to the high-current source via the test current—for example when performing measurements on inductors such as transformers—can be fed back again, in particular via a grid connection to a power grid, as a result of which in particular the power loss in the high-current source and therefore the required cooling can be reduced.

Figure 2:
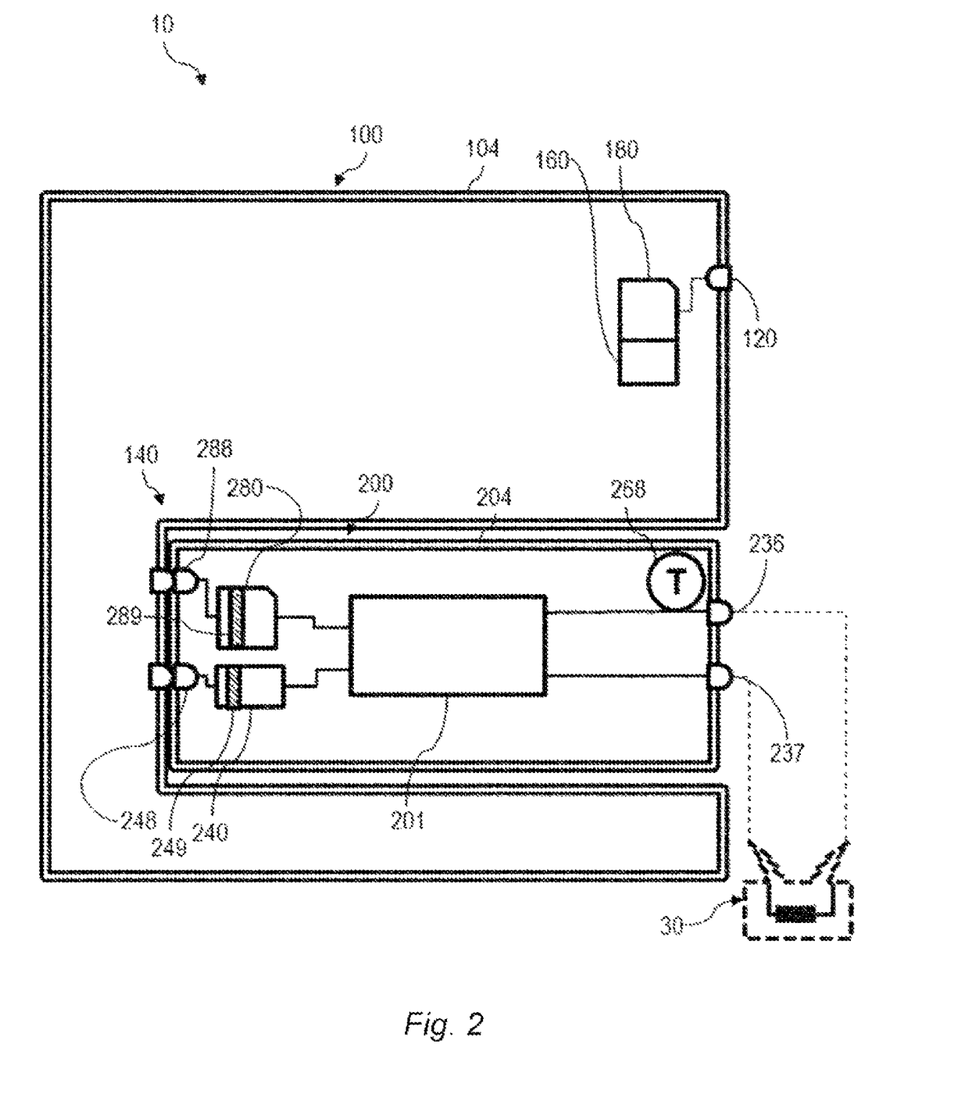
FIG. 2 shows a test system according to one embodiment.

FIG. 2 shows a test system 10 according to one embodiment of the present invention for testing an electrical energy apparatus with a test current.

In one exemplary embodiment, the test system 10 has a portable main device 100 with a housing 104 that has a module slot 140 for accommodating and connecting to an expansion module, and with a connection arrangement 120 arranged on the housing 104 for connecting to a portable additional device. In addition, the test system 10 has a high-current source 200 as the expansion module. In some variants, the test system 10 also has at least one portable additional device. In other variants, the test system 10 consists of the portable main device 100 and the high-current source 200. Furthermore, in some variants, the test system 10 does not have a connection arrangement 120.

The high-current source 200 can be designed as previously described. Furthermore, the high-current source 200 has a housing 204 for the module slot 140 and, arranged on the housing 204, an energy supply connection arrangement 248, an input connection arrangement 288 and a first and a second high-current connection 236, 237. In this case, the first high-current connection 236 is electrically connected to the first side of the bridge branch and the second high-current connection 237 is electrically connected to the second side of the bridge branch. Furthermore, the energy supply apparatus 240 and the control unit 280 of the high-current source 200, and the first plurality of first switchable half-bridges and the second plurality of second switchable half-bridges that are designed in the form of an integral unit 201 are arranged within the housing 204. In this way, the high-current source 200 can be connected as a unit to the portable main device 100 for generating test currents.

The portable main device 100 moreover has a measuring apparatus 160 for measuring measured variables and a control apparatus 180 for controlling the measuring device 160 and the high-current source 200 for testing the electrical energy apparatus.

Furthermore, FIG. 2 also shows the electrical energy apparatus 30. For testing and for feeding in the test current, the first high-current connection 236 is usually to be connected to a first connection point of the electrical energy apparatus 30 and the second high-current connection 237 to a second connection point of the electrical energy apparatus 30. In addition, for some measurements/tests, the measuring apparatus 160 can be connected to the first and/or second connection point or to further connection points of the electrical energy apparatus 30 via test connections or measurement connections (not shown), for example to measure a voltage between the first and the second connection point or for example an electric current through at least one of the connection points that is/are present there on account of the test current.

The portable main device 100 is configured to control the high-current source 200, when it is accommodated in the module slot 140, via the input connection arrangement 288 and to supply said high-current source with energy via the energy supply connection arrangement 248. The energy supply apparatus 240 is configured to receive electrical energy via the energy supply connection arrangement 248. The control unit 280 is configured to receive the input signal via the input connection arrangement 288.

In some variants, the energy supply apparatus 240 has a component for galvanic isolation 249 and is configured to provide the positive and the negative supply voltage in a manner galvanically isolated from the electrical energy received.

In some variants, the control unit 280 has a component for galvanic isolation 289 and is configured to actuate the first and second switchable half-bridges in a manner galvanically isolated from the input signal. This can advantageously be combined with variants in which the control unit 280 is configured to receive a digital input signal.

As shown in FIG. 2, some variants of the high-current source 200 have a temperature sensor apparatus 268 that is configured to capture a temperature at the first or at the second high-current connection 236, 237 or at at least one other location in the high-current source 200. In this case, the control unit 280 is configured to activate a fault mode of the high-current source 200 and to limit a current of the output signal depending on whether the temperature is above a predetermined temperature limit value. In some variants, in the fault mode, the high-current connections 236, 237 can also be isolated from the first and the second side of the bridge branch by means of switching means of the high-current source. Finally, the high-current source 200 is configured, controlled by the control apparatus 180, to generate an output signal between the first 236 and the second 237 high-current connection and therefore to provide the test current. A single-phase test current can therefore advantageously be provided between the first 236 and second 237 high-current connection.

Some variants of the high-current source 200, not shown here, are configured to generate a two-phase or three-phase test current. For this purpose, in some of these variants, the first plurality of first switchable half-bridges are used for a first phase and the second plurality of second switchable half-bridges are used for a second phase, for example relative to a ground potential or a center tap. In addition, some of these variants have a third high-current connection and a third plurality of third switchable half-bridges for a third phase. In this case, the control unit is configured to actuate the first, second and third plurality on the basis of an input signal, in particular a three-phase input signal, in such a way that an output signal is present in each case between the first and second plurality (i.e. in particular between the first and second high-current connection), between the second and third plurality (i.e. in particular between the second and third high-current connection) and between the third and first plurality (i.e. in particular between the third and first high-current connection), which output signal in particular corresponds in each case to a phase of the input signal. In this advantageous way, all three phases of an electrical energy apparatus, in particular a three-phase electrical energy apparatus, can be tested with in each case one test current, in particular simultaneously or without changing wiring.

Figure 3:
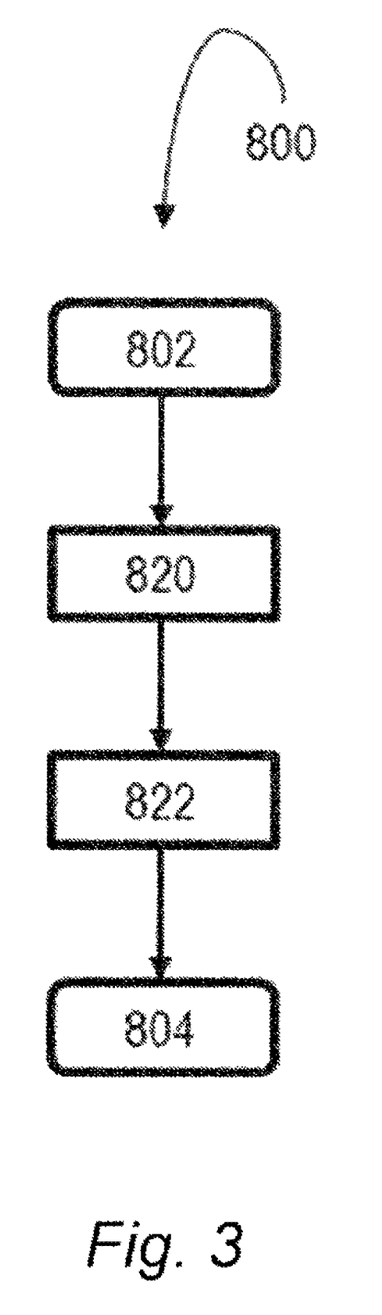
FIG. 3 shows a flow chart of the use of a high-current source or a test system according to one embodiment.

FIG. 3 shows a flow chart of the use 800 of a high-current source or a test system according to one embodiment of the present invention for testing an electrical energy apparatus with a test current.

In one embodiment, the use 800 includes the use start 802 and the use end 804 and use steps 820 and 822. The high-current source used and the test system used can be designed as previously described.

In use step 820, the test current is generated by means of the high-current source or the high-current source of the test system.

In use step 820, at least one measured variable is measured for the test by means of a measuring apparatus of the high-current source or the test system, wherein the at least one measured variable is based on at least one measurement signal that is generated on account of the test current.

In some variants, the test comprises at least one measurement that is selected from a group comprising: a microohm measurement; a winding resistance measurement; a CT ratio measurement; and a circuit breaker measurement. In this context, the circuit breaker measurement can be an "LV circuit breaker measurement" on a low-voltage circuit breaker in some variants.

The invention claimed is:

1. A high-current source for a test system for testing an electrical energy apparatus, comprising:
    a first plurality of first switchable half-bridges that are connected in parallel and through the number of which a test current is divided redundantly;
    a second plurality of second switchable half-bridges that are connected in parallel and through the number of which the test current is divided redundantly, the first plurality of first switchable half-bridges and the second plurality of second switchable half-bridges are configured to generate a current of at least 500 A as the test current; and
    a control unit that is configured to control, based on an input signal, the first plurality of first switchable half-bridges and the second plurality of second switchable half-bridges in such a way that an output signal for the test current is present on a bridge branch between the first switchable half-bridges and the second switchable half-bridges, which output signal corresponds to the input signal.

2. The high-current source as claimed in claim 1, wherein the control unit is configured to receive the input signal via an input connection arrangement of the high-current source and to control the first and second switchable half-bridges in a manner galvanically isolated from the input signal.

3. The high-current source as claimed in claim 1, wherein the number of the first or the second switchable half-bridges is at least twenty; and/or wherein the number of the first switchable half-bridges is equal to the number of the second switchable half-bridges.

4. The high-current source as claimed in claim 1, wherein the first plurality of first switchable half-bridges and the second plurality of switchable half-bridges are configured to generate at least one AC current with a frequency of at least 3 kHz or a DC current as the test current.

5. The high-current source as claimed in claim 1, wherein the first plurality of first switchable half-bridges and the second plurality of second switchable half-bridges are designed in the form of an integral unit and are arranged in a common housing.

6. The high-current source as claimed in claim 1, wherein:
    the first switchable half-bridges each have two controllable switching elements that are connected in series with a connecting point;
    the second switchable half-bridges each have two controllable switching elements that are connected in series with a connecting point;
    the connecting points of the first switchable half-bridges are connected in parallel and are electrically connected to a first side of the bridge branch;
    the connecting points of the second switchable half-bridges are connected in parallel and are electrically connected to a second side of the bridge branch; and
    the control unit is configured to control the controllable switching elements.

7. The high-current source as claimed in claim 6, wherein:
    the connecting points of the first switchable half-bridges are each electrically connected to the first side of the bridge branch via a filter element; and
    the connecting points of the second switchable half-bridges are each electrically connected to the second side of the bridge branch via a filter element.

8. The high-current source as claimed in claim 6, which further has:
    a first high-current connection for connecting a first connection point of the electrical energy apparatus; and
    a second high-current connection for connecting a second connection point of the electrical energy apparatus;
    wherein the first high-current connection is electrically connected to the first side of the bridge branch and the second high-current connection is electrically connected to the second side of the bridge branch.

9. The high-current source as claimed in claim 8, which further has a temperature sensor apparatus that is configured to capture a temperature at the first or at the second high-current connection; wherein the control unit is configured to activate a fault mode of the high-current source and to limit a current of the output signal depending on whether the temperature is above a predetermined temperature limit value.

10. A high-current source for a test system for testing an electrical energy apparatus, comprising:
    a first plurality of first switchable half-bridges that are connected in parallel and through the number of which a test current is divided redundantly;
    a second plurality of second switchable half-bridges that are connected in parallel and through the number of which the test current is divided redundantly;
    a control unit that is configured to control, based on an input signal, the first plurality of first switchable half-bridges and the second plurality of second switchable half-bridges in such a way that an output signal for the test current is present on a bridge branch between the first switchable half-bridges and the second switchable half-bridges, which output signal corresponds to the input signal, wherein the first switchable half-bridges each have two controllable switching elements that are connected in series with a connecting point;
    the second switchable half-bridges each have two controllable switching elements that are connected in series with a connecting point;
    the connecting points of the first switchable half-bridges are connected in parallel and are electrically connected to a first side of the bridge branch;
    the connecting points of the second switchable half-bridges are connected in parallel and are electrically connected to a second side of the bridge branch;
    the control unit is configured to control the controllable switching elements; and
    wherein the high-current source further comprises as a positive supply rail for distributing a positive supply voltage and a negative supply rail for distributing a negative supply voltage; wherein one of the two controllable switching elements of each of the first and second switchable half-bridges is electrically connected to the positive supply rail and a different one of the two controllable switching elements of each of the first and second switchable half-bridges is electrically connected to the negative supply rail.

11. A high-current source for a test system for testing an electrical energy apparatus, comprising:
   a first plurality of first switchable half-bridges that are connected in parallel and through the number of which a test current is divided redundantly;
   a second plurality of second switchable half-bridges that are connected in parallel and through the number of which the test current is divided redundantly; and
   a control unit that is configured to control, based on an input signal, the first plurality of first switchable half-bridges and the second plurality of second switchable half-bridges in such a way that an output signal for the test current is present on a bridge branch between the first switchable half-bridges and the second switchable half-bridges, which output signal corresponds to the input signal, wherein the high-current source further comprises an energy supply apparatus with a plurality of double-layer capacitors that is configured to provide a positive supply voltage and a negative supply voltage for the first and second switchable half-bridges and to buffer the positive and/or negative supply voltage by means of the double-layer capacitors.

12. The high-current source as claimed in claim 11, wherein the energy supply apparatus is configured to receive electrical energy via an energy supply connection arrangement of the high-current source and to provide the positive and the negative supply voltage in a manner galvanically isolated from the electrical energy received.

\* \* \* \* \*